United States Patent [19]

Kantorowicz et al.

[11] Patent Number: 4,670,674

[45] Date of Patent: Jun. 2, 1987

[54] ANALOG AND APERIODIC FREQUENCY DIVIDE-BY-TWO CIRCUIT

[75] Inventors: Gérard Kantorowicz; Didier Kaminsky, both of Paris, France

[73] Assignee: Thomson-CSF, Paris, France

[21] Appl. No.: 584,912

[22] Filed: Feb. 29, 1984

[30] Foreign Application Priority Data

Mar. 2, 1983 [FR] France .................. 83 03413

[51] Int. Cl.$^4$ .................. H03B 19/00; H03K 17/16
[52] U.S. Cl. .................. 307/529; 307/219.1; 307/271; 307/304; 328/15; 328/25; 455/333
[58] Field of Search .................. 328/25, 15; 307/529, 307/271, 219.1, 304; 455/323, 333, 332, 139, 112

[56] References Cited

U.S. PATENT DOCUMENTS

| | | | |
|---|---|---|---|
| 3,716,730 | 2/1973 | Cerny, Jr. .................. | 307/529 |
| 3,938,061 | 2/1976 | Levasseur et al. .................. | 333/138 |
| 4,308,473 | 12/1981 | Carnes .................. | 307/529 |
| 4,511,813 | 4/1985 | Pam .................. | 307/493 |
| 4,540,958 | 9/1985 | Neyens et al. .................. | 455/42 |

FOREIGN PATENT DOCUMENTS 0060153 5/1982 European Pat. Off. .

OTHER PUBLICATIONS

International Journal of Electronics, vol. 43, No. 2, Aug. 1977, pp. 185-191, A. Ammar et al.
Ahamed et al., "Frequency Divider-Multiplier Scheme for High Efficiency Microwave Power", IEEE Trans. on Communications, vol. COM-24, No. 2, pp. 243-249, Feb. 1976.

Primary Examiner—Stanley D. Miller
Assistant Examiner—Timothy P. Callahan
Attorney, Agent, or Firm—Oblon, Fisher, Spivak, McClelland & Maier

[57] ABSTRACT

A frequency divide-by-two circuit capable of operating from substantially DC up to the maximum operating frequency of the component devices. First and second mixer stages receive the signal to be divided and its antiphase complement. The mixer output signals are amplified and summed. A portion of the sum signal is fed back to the other inputs of the mixers. The mixing amplifying and summing functions can all be performed by two FETs each having two gates. The divider can be integrated on a single chip since it does not make use of a filter. It can be used at frequencies of up to about 25 GHz.

7 Claims, 5 Drawing Figures

ANALOG AND APERIODIC FREQUENCY DIVIDE-BY-TWO CIRCUIT

BACKGROUND OF THE INVENTION

1. Field of the Invention

The present invention relates to a frequency divider capable of operating at microwave frequencies.

2. Discussion of Background

A divide-by-two circuit in accordance with the invention is called analog to distinguish it from digital frequency dividers which switch between two states. Known digital dividers use bistable flip-flop type circuits compising a plurality of components in cascade, and suffer from non-negligible propagation delays and stray interference when operated at very high frequencies, which limits the maximum useable frequency. Known analog dividers include a mixer, an amplifier, a filter and a feedback loop. The Applicant's French patent application No. 81 03621 describes a circuit which is outlined in the block diagram of accompanying FIG. 1. In this circuit the functions of mixing, amplifying, and feedback, are provided by a single component, namely a dual gate field effect transistor (FET), thereby reducing transit time and stray interference. However, this circuit also requires a bandpass filter.

DETAILED DESCRIPTION OF THE PREFERRED EMBODIMENTS

The block diagram per se of such a divide-by-two circuit has been known for a long time, and the above-mentioned patent relates to a particlar implementation thereof. An input signal of frequency F is applied to a first input of a mixer 1, and its output signal is filtered by a bandpass filter 2 before being amplified by an amplifier 3 whose output provides the signal at the frequency F/2. A portion of the output signal at frequency F/2 is taken by a feedback loop and applied to a second input of the mixer 1. In this circuit, the positions of the amplifier 3 and the bandpass filter 2 may be interchanged. It is known that this type of divide-by-two circuit operates because oscillations appear at a sub-harmonic of the input signal (e.g. triggered by a transient or by noise), and are then filtered, amplified and regenerated by the mixer whch thus favors the frequency F/2 to the exclusion of all other frequencies, but only so long as the frequency F is applied to the first input of the mixer.

The divide-by-two circuit described in the above-mentioned patent uses a single two-gate FET both as mixer and as amplifier. However, since this type of mixer is intended for use at very high frequencies, eg. 20 GHz, the passband filter 2 is made from micro-strip technology, ie. metallizations on an insulating substrate. These strips of such a size that there is no way in which they could be deposited on an industrial scale on the same silicon chip in which the FET is made. A kind of hybrid circuit is thus used in whih a substrate supports both the semiconductor chip on which the FET is made and the filter-constituting micro-strips, together with input and output coupling transformers.

The divide-by-two circuit of the present invention constitutes an advance over the FIG. 1 divider in that it omits the bandpass filter 2, which means that an entire divider in accordance with the invention can be integrated on a single semiconductor chip.

SUMMARY OF THE INVENTION

The present invention provides an analog and aperiodic frequency divide-by-two circuit for dividing a periodic signal of frequency F over a very wide range of frequencies, the divide-by-two circuit comprising:
- a first signal mixer having a first input terminal on which it receives a first signal composed of a constant signal and a periodic signal of frequency F;
- a second mixer having a first input terminal on which it receives a second signal of frequency F, which is complementary to the first signal such that its periodic portion is in phase opposition with the periodic portion of the first signal; and
- an amplifier-summer which has two inputs on which it receives signals from the two mixers and having an output terminal on which it supplies a signal at the frequency F/2, a portion of the output signal being returned via a two-branch feedback loop to the mixers and being applied to the second input terminals of said mixers.

Advantageously, the divide-by-two circuit comprises first and second dual-gate field effect transistors (FETs), each of said FETs providing both the mixing and the amplifying functions in a single device, with the two gates of each FET constituting said first and second inputs for each mixer, and with the gain of each FET constituting the amplification stage and which the drains of the FETs being interconnected to provide the output terminal of the divider.

Since the divide-by-two circuit does not require a filter, it is not limited by the filter passband and can operate over a frequency range of DC to the maximum frequency of the devices used.

The maximum usable frequency for a divider in accordance with the invention is improved by the two FETs being connected in parallel so that the divider constitutes only a single stage, which is advantageous relative to prior dividers which switch between two states since the propagation delays in each stage of such dividers are cumulative.

Finally, since the filter is omitted, and since the divider can essentially be constituted by two transistors, it is readily integrated in a semiconductor chip using integrated circuit technology. Such integration is not possible with dividers that include a filter which, at microwave frequencies would be made of micro-strip of a size requiring a hybrid circuit type of substrate on which a transistor would be fixed together with inductors and capacitors. Making such a hybrid circuit on a silicon chip or on a gallium arsenide chip is possible but only at excessive cost. In contrast, a divider in accordance with the inention is readily included in integrated circuits on an industrial scale.

The divider in accordance with the invention processes two complementary input signals at the frequency F, ie. two signals in phase opposition, which signals are applied to two inputs in parallel. When dual-gate FETs are used, each of the input signals is applied to the second gate of a FET whose first gate receives a portion of the output signal via a feedback circuit. By convention, the gate adjacent to the source is called the first gate and the gate adjacent to the drain is called the second gate. The output signal from the each FET is representative of the product of the functions applied to the gates thereof. These output signals are summed, and since the input signals are complementary, summing has the effect of cancelling some of the unwanted frequencies produced by the mixing. The output signal is thus at a frequency of F/2.

BRIEF DESCRIPTION OF THE DRAWINGS

Two embodiments of the invention are described by way of example with reference to the accompanying drawings, in which.

MORE DETAILED DESCRIPTION

Figure 1:
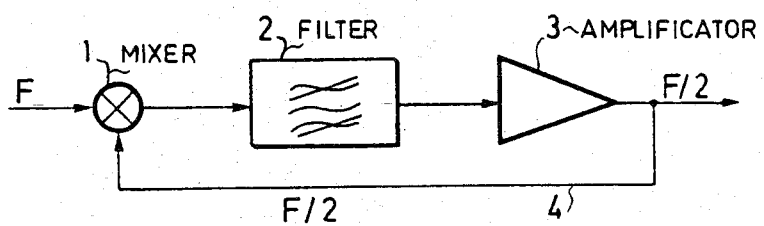
FIG. 1 is a block diagram of the prior art frequency divider already described under the heading "Background"
Figure 2:
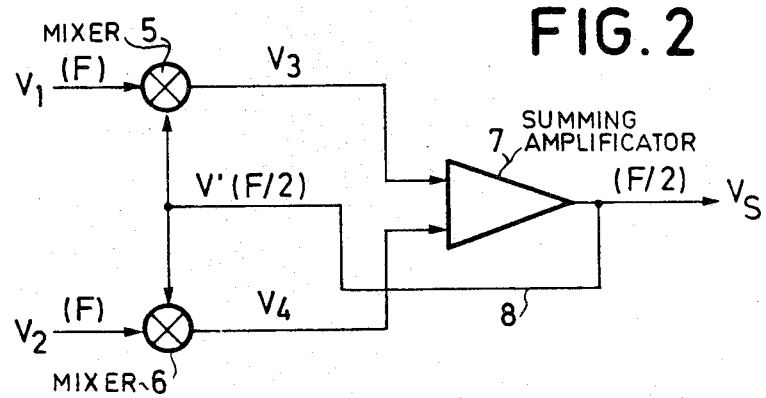
FIG. 2 is a block diagram of a frequency divider in accordance with the invention.

FIG. 2 is a block diagram of a divide-by-two circuit in accordance with the invention. It comprises two mixers 5 and 6 which perform two product functions, and an amplifier-summer function 7. A feedback loop 8 takes part of the signal from the sum output and returns it one of the inputs of each of the mixers 5 and 6.

Figure 3:
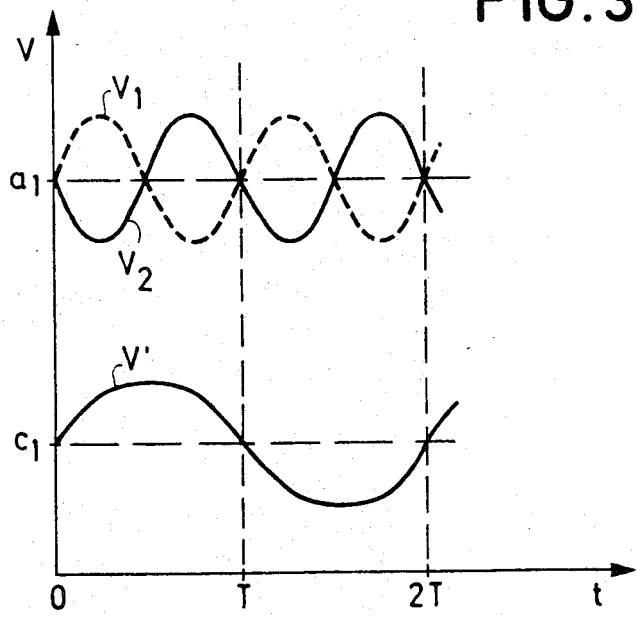
FIG. 3 is a waveform diagram of the input and output signals of a divider in accordance with the invention.

The operation of an aperiodic divide-by-two circuit in accordance with the invention requires that the two input signals $V_1$ and $V_2$ at frequency F as applied to the two Mixers 5 and 6 be complementary signals, ie. that they be in phase opposition, as shown in FIG. 3. To simplify the description, these two signals are supposed to be sinusoidal:

$$V_1 = a_1 + b_1 \sin(\omega t)$$

$$V_2 = a_1 - b_1 \sin(\omega t)$$

where $a_1$ and $b_1$ are constants and $\omega$ is angular frequency.

The signal V' at the frequency F/2 appears at the output from the frequency divider and is applied to the second inputs of the mixers 5 and 6. Given the above form for the input signals $V_1$ and $V_2$, the signal V' has the form:

$$V' = c_1 + d_1 \sin(\omega t/2).$$

The product p of two fnctions f and g as performed by a mixer device has first, second, third, etc. order terms, so each of the mixers 5 and 6 provides a product having the form:

$$p = fg + f^2g + fg^2 + f^2g^2 + \ldots$$

If product terms of higher than first order are ignored, either because the devices used have insufficient gain at such frequencies, or else because they are sufficiently linear for the corresponding signals to be negligible, and taking account of the fact that the mixers 5 and 6 retain the DC component, the output signals from the two mixers are as follows:

$$V_3 = k(a_1 + b_1 \sin(\omega t))(c_1 l + d_1 \sin(\omega t/2))$$

$$V_4 = k(a_1 - b_1 \sin(\omega t))(c_1 l + d_1 \sin(\omega t/2))$$

where k is a proportionality factor related to the mixer devices.

The output signal from the amplifier thus has the form:

$$V_s = k_s(V_3 + V_4)$$

$$= 2kk_s a_1(c_1 + d_1 \sin(\omega t/2))$$

where $k_s$ is a proportionality factor related to the summing circuit.

The output signal $V_s$ is proportional to the signal V', and feeding back a fraction of this output signal from the amplifier to the common point connected to both second inputs of the mixers constitutes a pair of coherent feedback loops, thereby enabling oscillation at the freqency F/2 so long as and only so long as the two complementary signals $V_1$ and $V_2$ at frequency F are applied to the mixers 5 and 6.

The divide-by-two circuit in accordance with the invention is thus set in motion by a transient or by noise which initiates a signal at frequency F/2 at the output from the amplifier 7, thereafter the divider latches to said frequency.

Figure 4:
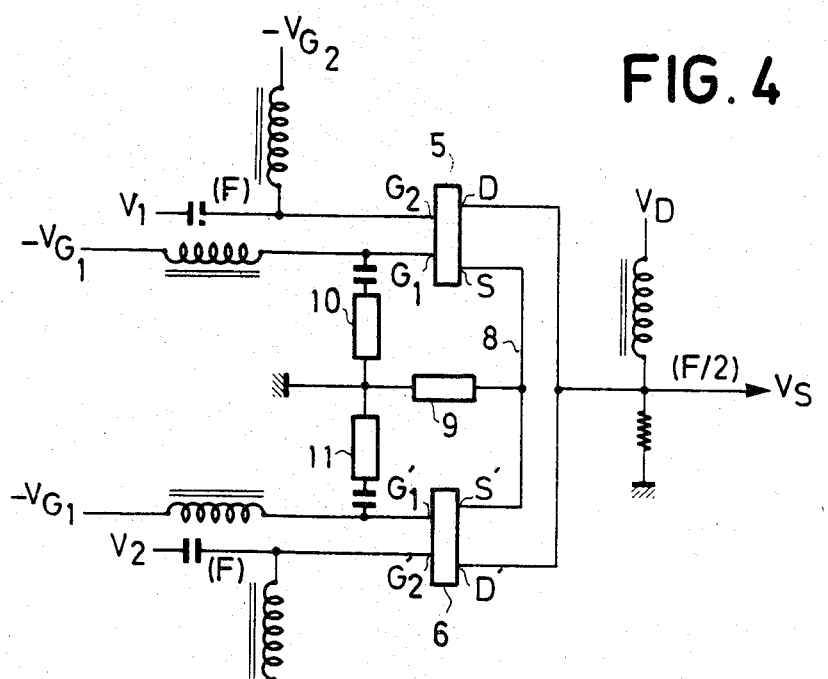
FIG. 4 is a circuit diagram of a first divide-by-two circuit in accordance with the invention.

One of the advantages of the invention is that the functions of amplification, summation, and multiplication retaining the DC component of the input signal can all be performed by a single dual-gate field effect transistor (FET), ie. two FETs overall, one for each of the separate mixers. FIG. 4 is a circuit diagram of a first embodiment of a divide-by-two circuit using FETs 5 and 6. The two transistors are connected with their drains D and D' in parallel, and with the drain-adjacent gates $G_2$ and $G'_2$ for the FETs 5 and 6 respectively connected to receive the in-phase input signal $V_1$ and the antiphase inpt signal $V_2$. The two-part feedback loop comprises a connection from the source to the other gate of each of the FETs, said other gates constituting the second inputs to the mixers.

In this type of circuit, the feedback via the loop 8 passes, for the first FET 5, via an impedance 9 connected to its source S and an impedance 10 connected to its first gate $G_1$, both of these impedances being connected to ground at microwave frequencies. The FET 6 uses the same impedance 9 connected to its source S' and an impedance 11 connected to its first gate $G'_1$, both impedance being likewise grounded.

The FETs are DC biassed by connectng their parallel connected drains D and D' to a voltage $V_D$ and by connecting their second gates $G_2$ and $G'_2$ via respective chokes to a voltage $-V_{G2}$. The first gates $G_1$ and $G'_1$ are similarly biassed by a voltage $-V_G$ via respective chokes.

Each of the transistors 5 and 6 thus constitutes a mixer for mixing the signals at the frequency F and the frequency F/2. Each also constitutes an output amplifier for the device. Since the outputs from the two drains are connected to a common point, the output signals are summed, and since each mixer provides an output signal containing harmonics such as F, F+F/2, etc . . . these harmonics cancel mutually when summed because they are antiphase. However, the harmonics at F/2 which is fed back by the two-branch feedback loop to the first gates $G_1$ and $G'_1$ of the two FETs 5 and 6 does not cancel since there is no phase opposition at the frequency F/2.

Figure 5:
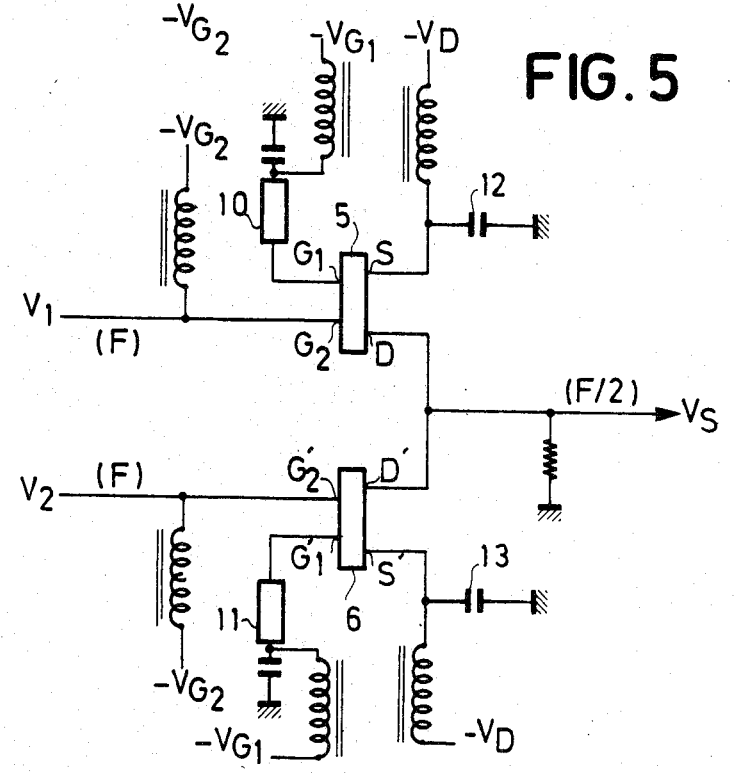
FIG. 5 is a circuit diagram of a second divide-by-two circuit in accordance with the invention.

FIG. 5 is the circuit diagram of a second divide-by-two circuit in which the FETs 5 and 6 are connected in common drain mode to set up internal feedback. As in the example shown in FIG. 4, the signals to be divided are applied in anti-phase to the second gates $G_2$ and $G'_2$ adjacent to the drains D and D' of the FETs. In this circuit, the second gates $G_2$ and $G'_2$ are similarly biassed via respective chokes to a voltage $-V_{G2}$ for applying the DC component to the FETs. The first gates $G_1$ and $G'_1$ receive negative feedback via respective impedances 10 and 11 which are grounded. The outputs from the two FET drains D and D' are connected to a common point which provides the output signal $V_s$ at the frequency F/2. However, the sources S and S' are biassed via respective chokes connected to a DC bias voltage $-V_D$. Capacitors 12 and 13 decouple the sources S and S' to ground respectively.

In both of the examples shown in FIGS. 4 and 5, it should be observed that a divider circuit in accordance with the invention has only one stage between its input gates $G_2$ and $G'_2$ and its output drains D and D', said single stage being constituted b two FETs operating in parallel. Thus, in comparison with prior art divide-by-two circuits which include a mixing stage and amplifier stage which may optionally be combined in a single stage, and also a filter stage, a divider in accordance with the invention which does not include a filter stage has a much shorter propagation delay, thereby enabling operation at higher frequencies than were previously possible. In particular, the frequency range of a divider in accordance with the present invention is no longer limited by a filter, and can thus extend from very low frequencies close to DC, up to the maximum useable frequencies of the FETs 5 and 6. If these FETs operate at up to 25 GHz, then the divider will operate from about 0 to 25 GHz.

To operate at such high frequencies the divider preferably uses Schottky gate FETs. The impedances 9, 10 and 11 generally comprise only a reactive component, which may be capacitive or inductive, but if capacitive the impedances may be made by means of the dielectric layer technique, eg. by a layer of silicon nitride extending between two layers of conductive material, or else being interdigitated therewith. Conductor layers can be made from conductive foil. The impedances are simple to make in that the entire circuit comprises only two FETs and three impedances, so it can readily be integrated on a chip of semiconductor material with the impedances being made simultaneously with some of the FET manufacturing steps.

Since a divider in accordance with the invention operates from very low frequencies it can be made from a relative slow material such as silicon. However, the divider is of greatest interest at very high frequencies, in which case it should be made from faster materials such as GaAs, for example. A divider in accordance with the invention thus has the advantage over prior dividers of being realizable in the form of an integrated circuit for use in any field of microelectronics, and in particular for dividing microwave frequencies of several GHz, eg. in frequency servo-loops in sender-receivers for telecommunications.

We claim:

1. An analog and aperiodic frequency divide-by-two circuit for dividing a periodic signal of frequency F over a very wide range of frequencies, the divide-by-two circuit comprising:

a first signal mixer for forming a product signal of a first input signal received at a first input terminal and a feedback signal received at a second input terminal wherein said first input signal is composed of a constant signal and a periodic signal of frequency F;

in parallel with said first signal mixer, a second mixer for forming a product signal of a second input signal at a first input terminal and a said feedback signal at a second input terminal wherein said second input signal has a frequency F, which is complementary to said first input signal such that its periodic portion is in phase opposition with the periodic portion of said first input signal; and an amplifier-summer which has two inputs on which it receives said product signal from said first mixer and said product signal from said second mixer said amplifier-summer having an output terminal on which it supplies an output signal at the frequency F/2, a portion of the output signal being returned via a two-branched feedback loop to said mixers and being applied as said feedback signal.

2. A frequency divider according to claim 1, comprising first and second two-gate field effect transistors (FETs), each of said FETs providing both the mixing and the amplifying functions in a single device, with the two gates of each FET constituting said first and second inputs for each mixer, and with the gain of each FET constituting the amplification stage and which the drains of the FETs being interconnected to provide the output terminal of the divider.

3. A frequency divider according to claim 2, comprising:

said first two-gate FET having its second gate biased by a DC voltage $-V_{G2}$ and also connected to receive a periodic signal of frequency F, the feedback loop of said first FET being constituted by a first impedance connected between said FET source and ground and by a second impedance connected between ground and the first gate of said first FET;

said second two-gate FET having its second gate biased by a DC voltage $-V_{G2}$ and also connected to receive a periodic signal of frequency F and in phase opposition to said periodic signal applied to said first FET, the feedback loop of said second FET being constituted by said first impedance conected between the second FET source and ground and by a third impedance connected between ground and the first gate of said second FET;

the drains of said FETs being biased by a DC voltage $V_D$ and being interconnected to a common point which constitutes the output of the divider at which the signal at frequency F/2 is provided.

4. A frequency divider according to claim 2, comprising:

said first two-gate FET having its second gate biassed by a DC voltage $-V_{G2}$ and also connected to receive a periodic signal of frequency F, and having its first gate connected to ground via a first impedance, said FET having a source coupled to ground by a capacitor and being biassed by a DC voltage $-V_D$, the feedback loop of said first FET being constituted by internal feedback between the gates and the drain thereof;

said second two-gate FET having its second gate biassed by the DC voltage $-V_{G2}$ and also connected to receive a periodic signal of frequency F in phase opposition to said periodic signal applied to the second gate of said first FET, and having its first gate connected to ground via a second impedance, the source of said FET being coupled to ground by a capacitor and being biassed by the DC voltage −VD, the feedback loop of said second FET beng constituted by internal feedback between the gates and the drain thereof;

the drains of said FETs being interconnected to a common point which constitutes the output of the divider at which the signal at frequency F/2 is provided.

5. A divider according to claim 2, having a single stage between its input terminals and its output terminal, said single stage being constituted by said two FETs which are connected in parallel, with the maximum usable frequency of the divider being the maximum operating frequency of said FETs.

6. A frequency divider according to claim 2, wherein said FETs are Schottky gate type FETs, and wherein said feedback loop includes feedback impedances which are made by depositing respective dielectric layers on conductive layers on a substrate common to said FETs and by depositing respective conductive layers on said dielectic layers.

7. A frequency divider according to claim 6, wherein the divider is realized in integrated circuit technology on a single chip of semiconductor material.

* * * * *